United States Patent
Betsinger

(10) Patent No.: US 10,527,205 B2
(45) Date of Patent: Jan. 7, 2020

(54) WAVE CONTACT ARRANGEMENT FOR HOSE ASSEMBLY

(71) Applicant: EATON INTELLIGENT POWER LIMITED, Dublin (IE)

(72) Inventor: James Dean Betsinger, Waterville, OH (US)

(73) Assignee: Eaton Intelligent Power Limited, Dublin (IE)

( * ) Notice: Subject to any disclaimer, the term of this patent is extended or adjusted under 35 U.S.C. 154(b) by 552 days.

(21) Appl. No.: 14/428,158

(22) PCT Filed: Sep. 12, 2013

(86) PCT No.: PCT/US2013/059465
§ 371 (c)(1),
(2) Date: Mar. 13, 2015

(87) PCT Pub. No.: WO2014/043351
PCT Pub. Date: Mar. 20, 2014

(65) Prior Publication Data
US 2015/0240972 A1    Aug. 27, 2015

Related U.S. Application Data

(60) Provisional application No. 61/701,307, filed on Sep. 14, 2012.

(51) Int. Cl.
*F16L 11/127* (2006.01)
*G01M 5/00* (2006.01)
(Continued)

(52) U.S. Cl.
CPC ............. *F16L 11/127* (2013.01); *F16L 25/01* (2013.01); *F16L 33/2076* (2013.01); *G01M 3/18* (2013.01);
(Continued)

(58) Field of Classification Search
CPC .................................................... F16L 11/127
See application file for complete search history.

(56) References Cited

U.S. PATENT DOCUMENTS 2,291,070 A    7/1942 Bruno
2,436,949 A    3/1948 Anderson
(Continued)

FOREIGN PATENT DOCUMENTS

DE    31 40 804 A1    4/1983
DE    40 30 788 A1    8/1991
(Continued)

OTHER PUBLICATIONS

International Search Report and Written Opinion for Application No. PCT/US2011/061865 dated May 21, 2012.
(Continued)

*Primary Examiner* — Lisa M Caputo
*Assistant Examiner* — Alex T Devito
(74) *Attorney, Agent, or Firm* — Merchant & Gould P.C.

(57) ABSTRACT

An integrated hose assembly, monitoring assembly, and method of use are disclosed. The integrated hose assembly includes a hose assembly including a hose having first and second conductive layers, the first conductive layer electrically connected to a nipple and the second conductive layer electrically connected to a socket. The first and second conductive layers are separated by an insulating layer. The integrated hose assembly further includes a monitoring assembly that includes a housing rotatably mounted around at least a portion of the hose assembly, a first wave contact seated within the housing and electrically contacting a first outer surface of the hose assembly that is electrically connected to the first conductive layer, and a second wave contact seated within the housing and electrically contacting a second outer surface of the hose assembly that is electri- (Continued)

cally connected to the second conductive layer. The monitoring assembly further includes a monitoring circuit electrically connected to the first wave contact and the second wave contact.

18 Claims, 10 Drawing Sheets

(51) Int. Cl.
| F16L 25/01 | (2006.01) |
| G01M 3/18 | (2006.01) |
| F16L 33/207 | (2006.01) |
| H01R 43/04 | (2006.01) |
| G01R 31/04 | (2006.01) |

(52) U.S. Cl.
CPC ........ *G01M 5/0025* (2013.01); *G01M 5/0033* (2013.01); *G01M 5/0083* (2013.01); *H01R 43/04* (2013.01); *F16L 2201/30* (2013.01); *G01R 31/04* (2013.01); *Y10T 29/49204* (2015.01)

(56) References Cited

U.S. PATENT DOCUMENTS

| 2,451,450 | A | * | 10/1948 | Spraragen | E06B 7/2318 |
| | | | | | 49/498.1 |
| 4,029,889 | A | | 6/1977 | Mizuochi | |
| 4,229,613 | A | | 10/1980 | Braun | |
| 4,446,892 | A | | 5/1984 | Maxwell | |
| 5,102,012 | A | * | 4/1992 | Foster | G01M 3/18 |
| | | | | | 138/104 |
| 5,159,200 | A | | 10/1992 | Dunbar et al. | |
| 5,267,670 | A | | 12/1993 | Foster | |
| 5,343,738 | A | | 9/1994 | Skaggs | |
| 5,387,899 | A | | 2/1995 | DiLauro et al. | |
| 5,442,810 | A | | 8/1995 | Jenquin | |
| 5,551,484 | A | | 9/1996 | Charboneau | |
| 5,634,497 | A | | 6/1997 | Neto | |
| 5,671,689 | A | | 9/1997 | Clapp et al. | |
| 5,969,618 | A | | 10/1999 | Redmond | |
| 5,992,218 | A | | 11/1999 | Tryba et al. | |
| 6,384,611 | B1 | | 5/2002 | Wallace et al. | |
| 6,386,237 | B1 | | 5/2002 | Chevalier et al. | |
| 6,498,991 | B1 | | 12/2002 | Phelan et al. | |
| 6,735,705 | B1 | | 5/2004 | Egbert et al. | |
| 6,910,899 | B1 | * | 6/2005 | Daume | F16L 11/127 |
| | | | | | 439/100 |
| 6,958,615 | B2 | | 10/2005 | Poulbot et al. | |
| 7,555,936 | B2 | | 7/2009 | Deckard | |
| 8,087,430 | B1 | | 1/2012 | Betz et al. | |
| 8,183,872 | B2 | | 5/2012 | Stark | |
| 8,217,669 | B1 | | 7/2012 | Watkins, Jr. | |
| 8,515,687 | B2 | | 8/2013 | Pereira et al. | |
| 8,829,929 | B1 | | 9/2014 | Watkns, Jr. | |
| 8,997,792 | B2 | | 4/2015 | Betsinger et al. | |
| 2001/0018845 | A1 | | 9/2001 | Roberts | |
| 2002/0154029 | A1 | | 10/2002 | Watters et al. | |
| 2003/0164048 | A1 | | 9/2003 | Shkel | |
| 2004/0065377 | A1 | | 4/2004 | Whiteley | |
| 2005/0253821 | A1 | | 11/2005 | Roeder | |
| 2006/0196722 | A1 | | 9/2006 | Makabe et al. | |
| 2006/0226701 | A1 | | 10/2006 | Gatz et al. | |
| 2007/0051166 | A1 | | 3/2007 | Baker et al. | |
| 2007/0131035 | A1 | | 6/2007 | Krutz et al. | |
| 2008/0036617 | A1 | | 2/2008 | Arms et al. | |
| 2009/0042419 | A1 | * | 2/2009 | Palomo | H01R 12/585 |
| | | | | | 439/82 |
| 2010/0007325 | A1 | | 1/2010 | Stark | |
| 2010/0174495 | A1 | | 7/2010 | Pereira et al. | |
| 2010/0308575 | A1 | | 12/2010 | Rodenburg | |
| 2011/0152024 | A1 | | 6/2011 | Kuehl | |
| 2011/0226302 | A1 | | 9/2011 | Farmer et al. | |
| 2011/0281488 | A1 | | 11/2011 | Li | |
| 2012/0278018 | A1 | | 4/2012 | Hastreiter | |
| 2012/0136592 | A1 | | 5/2012 | Pereira et al. | |
| 2012/0204923 | A1 | | 8/2012 | Ortiz et al. | |
| 2013/0134992 | A1 | | 5/2013 | Zhu et al. | |
| 2014/0076449 | A1 | | 3/2014 | Betsinger et al. | |
| 2014/0238109 | A1 | | 8/2014 | Wells et al. | |
| 2014/0265561 | A1 | | 9/2014 | Beining | |
| 2015/0177172 | A1 | | 6/2015 | Upasani et al. | |
| 2015/0300538 | A1 | | 10/2015 | Al-Atat et al. | |

FOREIGN PATENT DOCUMENTS

| EP | 1 126 205 A1 | 8/2001 |
| EP | 1 722 217 A1 | 11/2006 |
| EP | 2 261 546 A1 | 12/2010 |
| GB | 1574749 A | 9/1980 |
| JP | 2011027216 A | 2/2011 |
| WO | WO 03/079749 A2 | 10/2003 |
| WO | WO 2008/001238 A2 | 1/2008 |
| WO | WO 2008/059226 A2 | 5/2008 |
| WO | 2011143384 A1 | 11/2011 |
| WO | WO 2012/012482 A1 | 1/2012 |
| WO | WO 2012/071424 A2 | 5/2012 |
| WO | WO 2012/149161 A1 | 11/2012 |

OTHER PUBLICATIONS

International Search Report and Written Opinion for Application No. PCT/US2012/035216 dated Jul. 16, 2012.
International Search Report and Written Opinion for Application No. PCT/US2014/017590 dated Jun. 3, 2014.
International Search Report for Application No. PCT/IN2012/000296 dated Nov. 27, 2012.
International Search Report for Application No. PCT/US2013/030966 dated Aug. 1, 2013.
Invitation to Pay Additional Fees with Partial International Search for Application No. PCT/US2013/048660 dated Mar. 24, 2014.
International Search Report and Written Opinion for Application No. PCT/US2013/048660 dated Sep. 8, 2014.
Invitation to Pay Additional Fees with Partial International Search for Application No. PCT/US2013/059473 dated Feb. 28, 2014.
International Search Report and Written Opinion for Application No. PCT/US2013/059473 dated Jul. 18, 2014.
International Search Report and Written Opinion for Application No. PCT/US2014/029286 dated Jun. 18, 2014.
Holland, Z. et al., "Layered Polymer Whole Structure Health Monitoring Using Capacitance Sensing", *IEEE/ASME International Conference on Advanced Intelligent Mechatronics*, Montreal, Canada, Jul. 6-9, 2010, pp. 943-946.
Radtke et al., Design of Power-Transmitting Hydraulic Hose with Integrated Controller Area Network and Life-Sensing Capability, 2005 Agricultural Equipment Technology Conference, Feb. 15, 2005.
Hewlett Packard Technical Manual, printed Apr. 24, 2003, 8 Pages.
Guo, Z. et al., "GRE: Graded Residual Energy Based Lifetime Prolonging Algorithm for Pipeline Monitoring Sensor", *9th International Conference on Parallel and Distributed Computing Applications and Technologies*, 203-210 (2008).
Mohamed, M. et al., "Power Harvesting for Smart Sensor Networks in Monitoring Water Distribution System", *International Conference on Networking, Sensing and Control*, 393-398 (2011).
Ok, C. et al., "Optimal Transmission Power in Self-sustainable Sensor Networks for Pipeline Monitoring", *IEEE International Conference on Automation Science and Engineering*, 591-596 (2007).
International Search Report for corresponding International Patent Application No. PCT/US2013/059465 dated Nov. 26, 2013.
European Search Report for Application No. 12875245.8 dated Dec. 15, 2015.

* cited by examiner

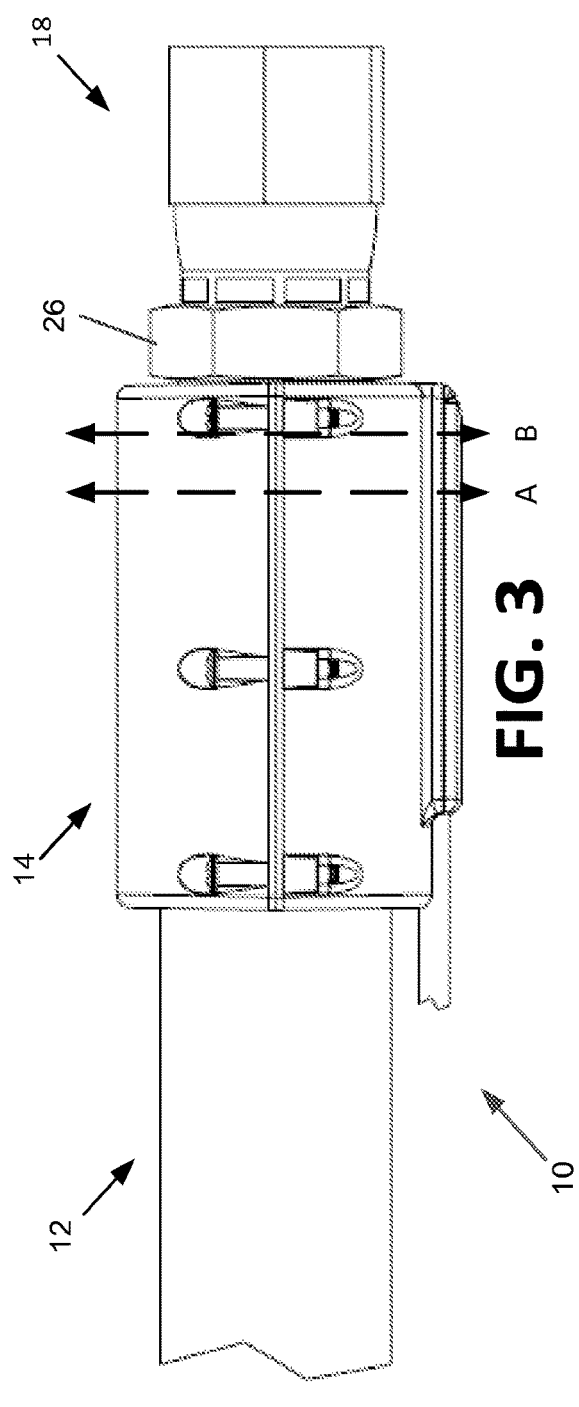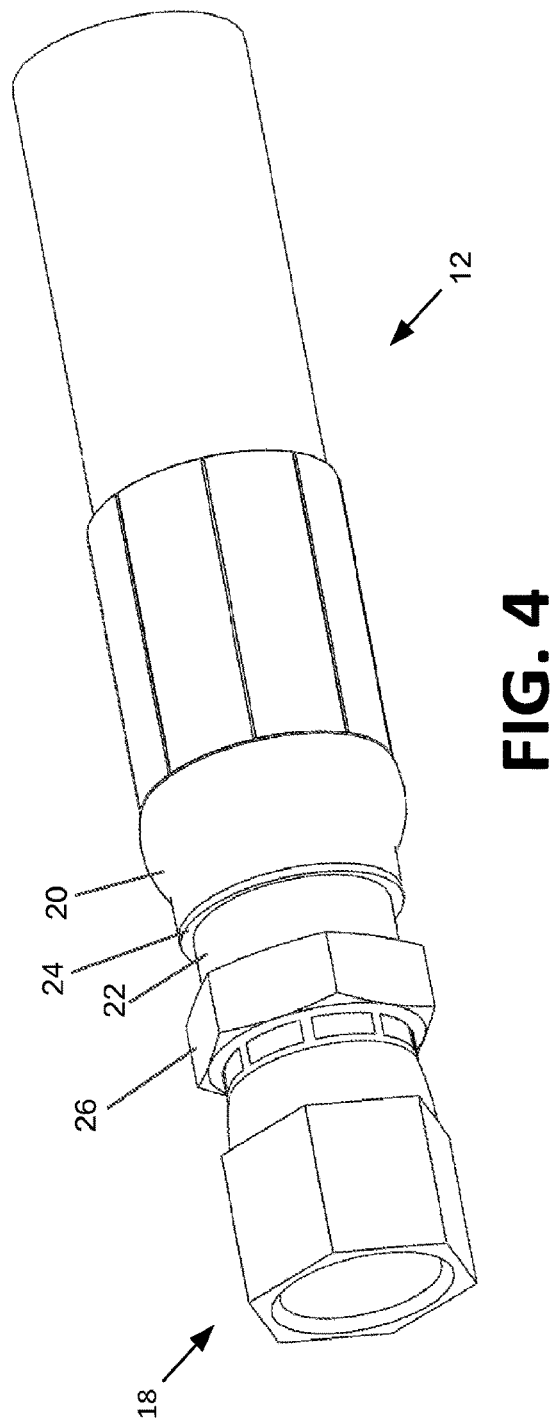
FIG. 3
FIG. 4

WAVE CONTACT ARRANGEMENT FOR HOSE ASSEMBLY

This application is a National Stage Application of PCT/US2013/059465, filed 12 Sep. 2013, which claims benefit of U.S. Patent Application Ser. No. 61/701,307 filed on 14 Sep. 2012 and which applications are incorporated herein by reference. To the extent appropriate, a claim of priority is made to each of the above disclosed applications.

TECHNICAL FIELD

The present application relates generally to a hose assembly, and in particular to an electrical contact arrangement for a hose assembly. Specifically, the present application relates to a wave contact arrangement for a hose assembly.

BACKGROUND

High pressure reinforced hydraulic hose is typically used on a variety of fluid power operated machines, such as earth-moving machines, to provide a flexible connection between several moving parts of a hydraulic circuit employed on or within the machine. Such hoses may include a hollow polymeric inner tube on which successive cylindrical layers of reinforcing material, such as wire or textile, are concentrically applied to contain the radial and axial pressures developed within the inner tube.

Many applications are demanding hose constructions with both high burst strength and long term fatigue resistance. Using conventional technology, the burst strength of a hose design may be increased by adding additional reinforcing material and/or layers, a practice which is generally discouraged because of its negative impact on the flexibility of the hose, or by universally increasing the tensile strength of each layer of reinforcement material, which may come at the expense of hose fatigue resistance.

To determine the robustness of a hose design, a hose manufacturer typically performs, among other tests, an impulse test and a burst test on the hose. An impulse test measures a hose design's resistance to fatigue failure by cyclically subjecting the hose to hydraulic pressure. A burst test, on the other hand, is a destructive hydraulic test employed to determine the ultimate strength of a hose by uniformly increasing internal pressure until failure. Based on these and other tests, a manufacturer can estimate a hose life that can be used to determine when a hose has reached the end of its life and may require replacing.

In some circumstances, it is desirable to detect, in a non-destructive and non-disruptive manner a likelihood of failure of a hydraulic hose. One solution providing this capability is discussed in U.S. Pat. No. 7,555,936, and discloses connecting a monitor circuit between two parallel, at least partially-conductive layers of a hose wall. A change in an electrical property observed by that monitor circuit may indicate a change in a property of the hose wall structure that might indicate impending failure of the hose wall.

To determine whether changes in electrical properties of a hose assembly have occurred, an electrical circuit is applied to the conductive layers of the hose wall. This may be accomplished through use of spring-style contacts, or otherwise pressing electrical contacts into the hose wall at a location where the conductive layer of interest is exposed. However, such an arrangement has drawbacks. For example, it can be difficult to obtain a reliable electrical connection between the contacts associated with the electrical circuit and the hose layers. Vibrations or stress on the hose can cause damage to these contacts as well, which may wear the contacts quickly. Additionally, due to exposure to environmental conditions (heat, cold, moisture, dirt, etc.), spring-type electrical contacts can corrode or otherwise have their electrical connection interrupted by debris, thereby weakening or disrupting the connection between the electrical circuit and the conductive layer of the hose. This can cause electrical disconnection of the electrical circuit from the conductive layers, thereby either triggering a fault in the circuit or falsely detecting degradation of the hose itself.

For these and other reasons, improvements are desirable.

SUMMARY

In accordance with the following disclosure, the above and other issues are addressed by the following:

In a first aspect, an integrated hose assembly includes a hose assembly including a hose having a first conductive layer and a second conductive layer, the first conductive layer electrically connected to a nipple and the second conductive layer electrically connected to a socket. the first and second conductive layers are separated by an insulating layer. The integrated hose assembly further includes a monitoring assembly that includes a housing rotatably mounted around at least a portion of the hose assembly, a first wave contact seated within the housing and electrically contacting a first outer surface of the hose assembly that is electrically connected to the first conductive layer, and a second wave contact seated within the housing and electrically contacting a second outer surface of the hose assembly that is electrically connected to the second conductive layer. The monitoring assembly further includes a monitoring circuit electrically connected to the first wave contact and the second wave contact.

In a second aspect, a monitoring assembly includes a housing rotatably mountable around at least a portion of a hose assembly having first and second electrically conductive outer surfaces forming contact points for an electrical circuit including the hose assembly. The monitoring assembly also includes a first wave contact seated within the housing and electrically contacting the first outer surface of the hose assembly, and a second wave contact seated within the housing and electrically contacting the second outer surface of the hose assembly. The monitoring assembly also includes a monitoring circuit electrically connected to the first wave contact and the second wave contact.

In a third aspect, a method of contacting a monitoring assembly to a hose assembly. The method includes rotatably mounting a housing of a monitoring assembly around at least a portion of a hose assembly, thereby electrically contacting a first electrically conductive outer surface of the hose assembly with a first wave contact and electrically contacting a second electrically conductive outer surface of the hose assembly with a second wave contact, the first and second wave contacts each electrically connected to a monitoring circuit within the housing.

BRIEF DESCRIPTION OF THE DRAWINGS

FIG. 3 is a side plan view of the integrated hose assembly of FIG. 1;

FIG. 4 is a perspective view of the integrated hose assembly of FIG. 1 with the monitoring assembly removed;

FIG. 14 is a side view of an example wave contact;

FIG. 15 is a perspective view of a wave contact according to an alternative embodiment having a crimp or solder-style circuit board connector; and FIG. 16 is a perspective view of a wave contact according to a further alternative embodiment and having a compliant-style circuit board connector.

DETAILED DESCRIPTION

Figure 1:
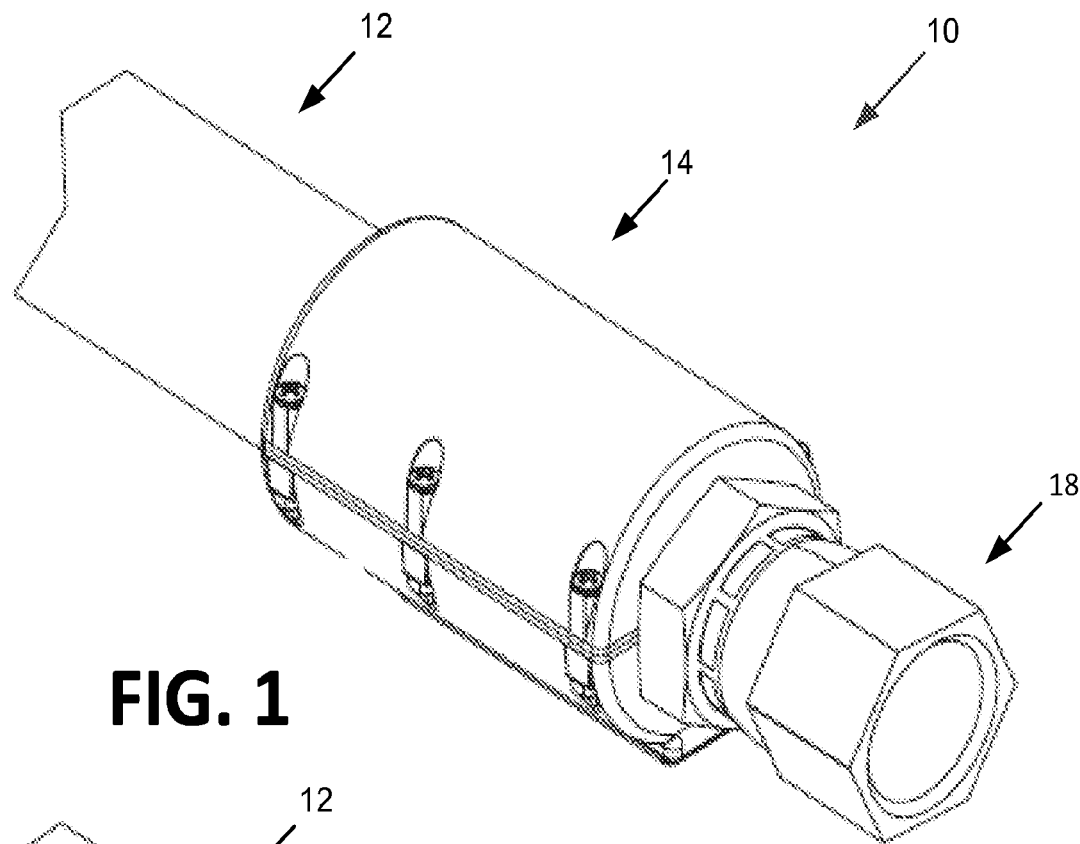
FIG. 1 is a top perspective view of an integrated hose assembly having a monitoring assembly mounted to a hose assembly, according to an example embodiment.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general the present disclosure relates to a wave contact arrangement, such as could be used in a failure monitoring assembly for a hose assembly. The wave contact arrangement disclosed herein generally provides for multiple points of contact along a conductive surface, thereby ensuring reliable electrical contact is maintained between the wave contact and a conductive component or conductive concentric layer of a hose or other cylindrical object. Using the wave contact in particular in outdoor or other environmentally-exposed applications provides still further advantages; by using such contacts in a housing rotatably mounted to a hose or cylindrical surface, physical rotation of the wave contact causes an abrasive effect between the wave contact and the surface it contacts, thereby scraping dirt or other debris away from a metallic (conductive) surface and improving the electrical interconnection between that surface and the contact.

Figure 2:
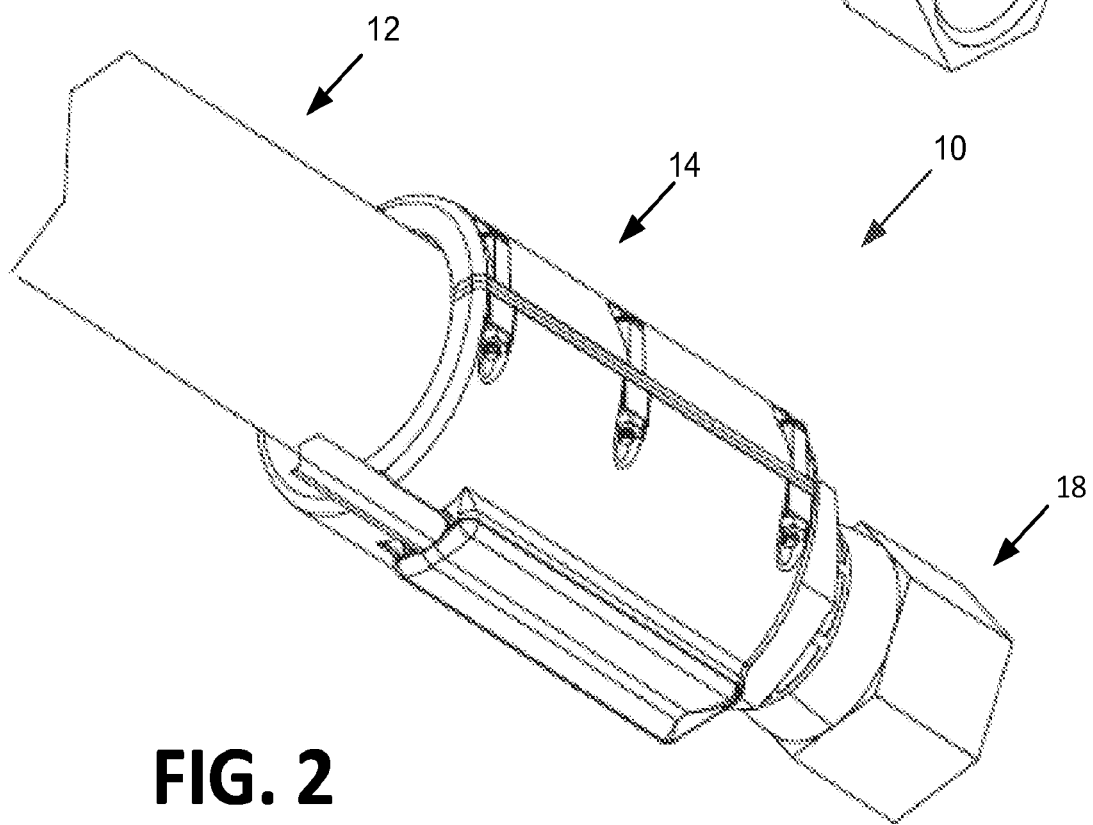
FIG. 2 is a bottom perspective view of the integrated hose assembly of FIG. 1.

Referring now to FIGS. 1-3, an integrated hose assembly 10 is illustrated that includes a hose assembly 12 and a monitoring assembly 14. The hose assembly 12 generally includes a hose having a connectorized end 18. The connectorized end 18 generally includes a nipple and socket arrangement configured to form a hydraulic seal with a complementary connector. Other connectorization arrangements are possible as well.

Although in the embodiment shown the hose represents a hydraulic hose; in other embodiments, other applications or types of hoses could be used. Example embodiments of the hose assembly with which failures can be detected via monitoring of electrical properties of a hose are illustrated in connection with FIGS. 7-9, below. Generally, the embodiments of hose assemblies described below include a plurality of conductive layers that allow for remote electronic monitoring of the continuity or physical condition of the hose by detecting various electrical response conditions when voltage is applied across the conductive layers.

In the embodiment shown, the monitoring assembly 14 is generally shaped as a hollow cylindrical collar sized to be fit around an area proximate to a connectorized end 18 of the housing. Generally, the monitoring assembly 14 includes a housing 15 constructed from housing portions 15a-b that, when interconnected, forms a generally hollow cylindrical arrangement having an internal diameter sized to fit around a hose without axial movement along the hose, while allowing rotational movement of the assembly. This may be accomplished, for example, by locating the monitoring assembly 14 at an area of the hose having a variety of external diameters, such as near the connectorized end 18. As seen in FIGS. 1-3 and FIGS. 5-6, the monitoring assembly 14 can be constructed from a plurality of housing portions 15a-b and screwed together around the hose assembly; in other embodiments, different interconnection structures could be used. One alternative of such a monitoring assembly is disclosed in U.S. patent application Ser. No. 13/458,691, filed on Apr. 27, 2012, and entitled "Degradation Monitoring System for Hose Assembly", the disclosure of which is hereby incorporated by reference in its entirety.

Figure 6:
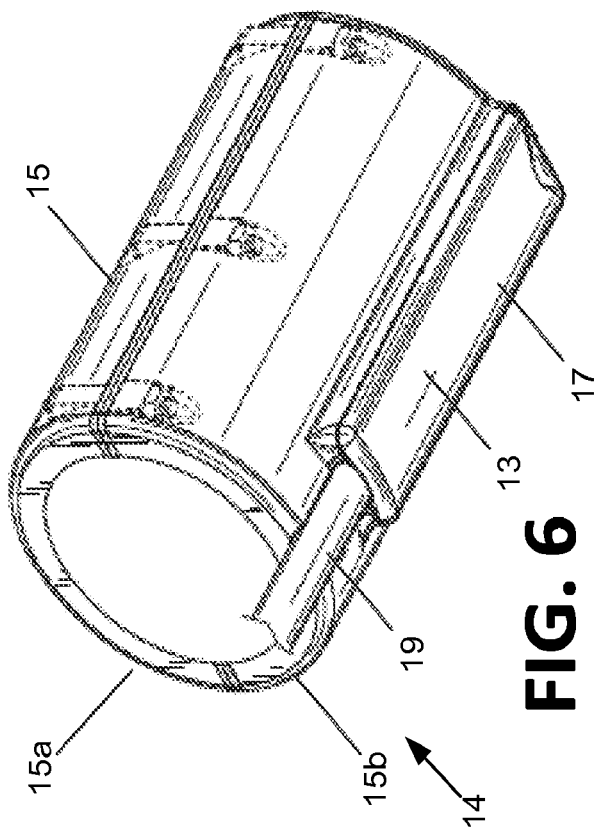
FIG. 6 is a rear perspective view of the monitoring assembly of FIG. 5.
Figure 5:
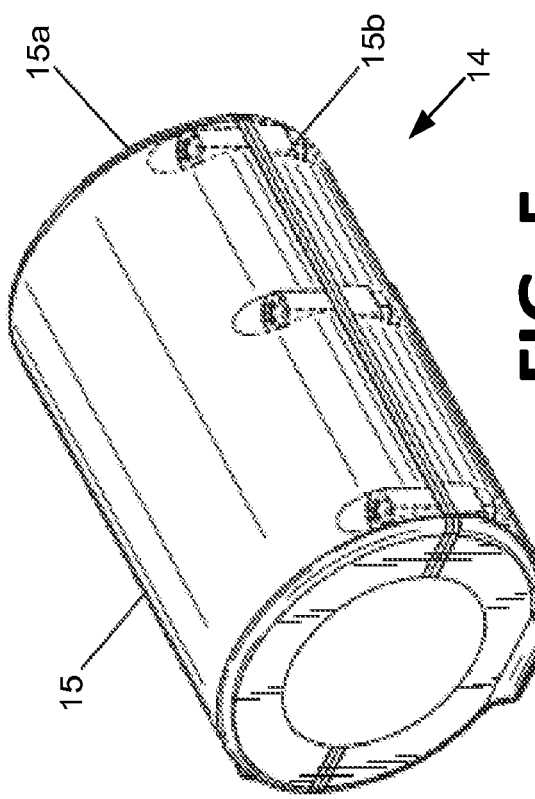
FIG. 5 is a front perspective view of the monitoring assembly, according to an example embodiment.
Figure 12:
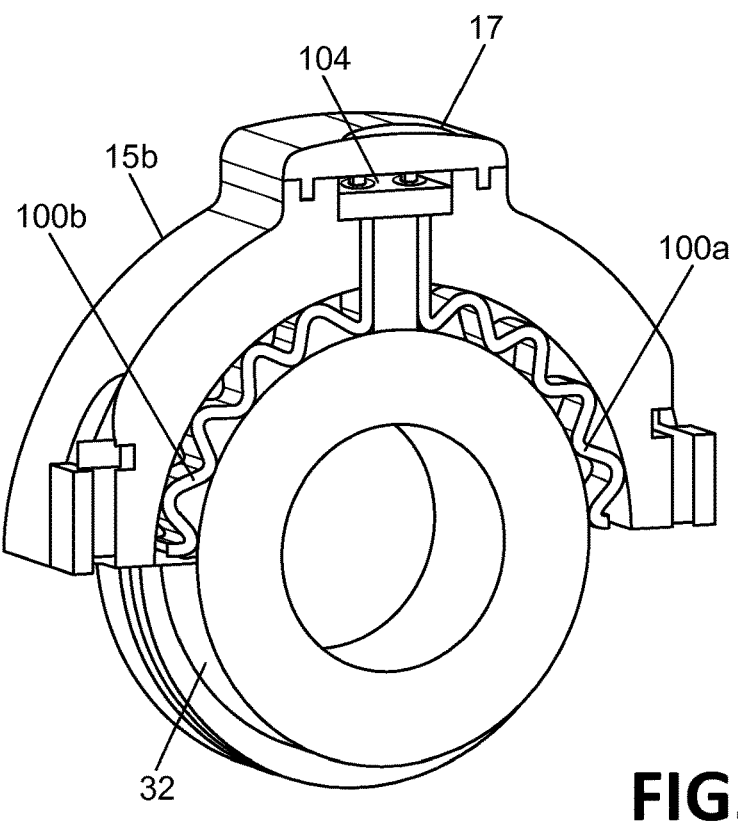
FIG. 12 is a cross-sectional view of the hose assembly and monitoring assembly of FIGS. 1-3, and, particularly at plane B of FIG. 3, illustrating electrical connection of a second wave contact to a nipple of the hose assembly.
Figure 13:
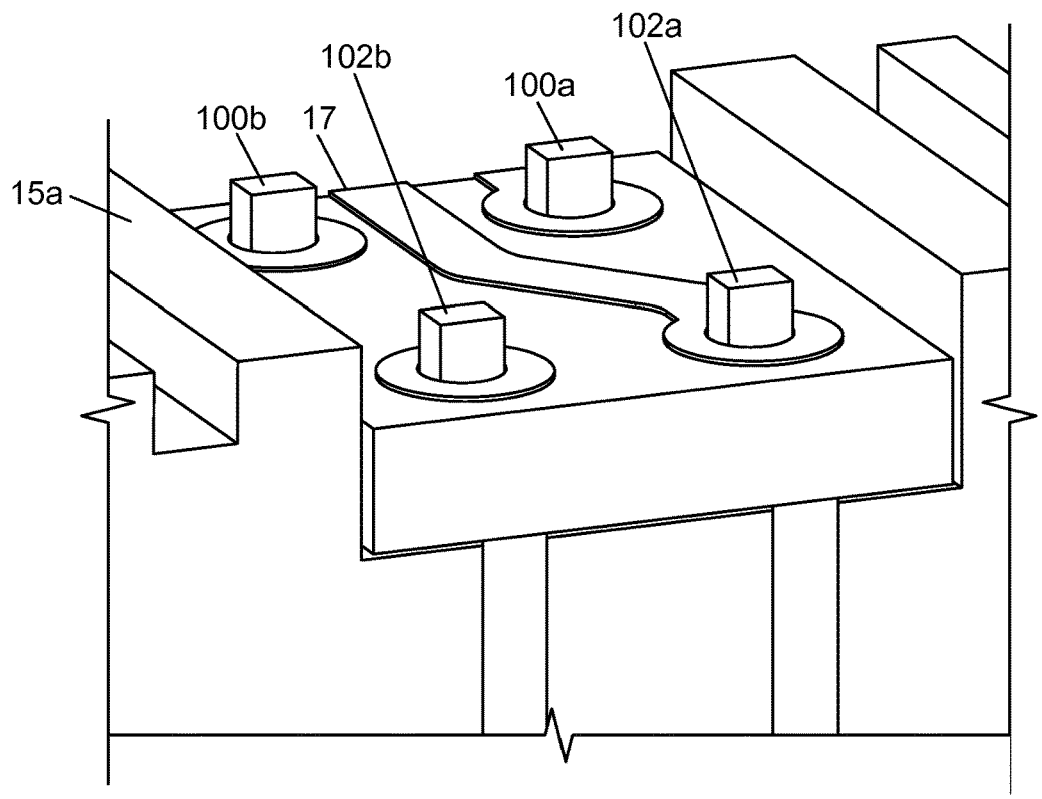
FIG. 13 illustrates electrical connection of wave contacts to a circuit board within the monitoring assembly.

As seen most clearly in FIGS. 6 and 12-13, in the example embodiment shown, the housing 15 has a circuit module 13 formed thereon having removable cover 17 that, when removed, allows access to a monitoring circuit. In the embodiment shown, the monitoring circuit is a wired circuit, and a wire 19 extending therefrom. In alternative embodiments, a wireless arrangement could be used.

As seen in FIG. 4, the monitoring assembly 14 can be affixed around an area of the hose having a tapered section 20 and a narrowed extension 22, each of which are generally circular in cross-sectional shape, and which have differing diameters. By affixing the monitoring assembly 14 at such a location, the assembly can be rotated once mounted on the hose assembly 12, but will not move axially along the hose. As illustrated in FIG. 4, the tapered section 20 and narrowed extension 22 are separated by an insulating layer 24 positioned therebetween, which acts to electrically isolate the separate portions of the tapered section 20 and the narrowed extension 22. A rotatable hexagonal nut 26 can be located toward the connectorized end 18 from the narrowed section.

In the embodiment shown in FIG. 4, the tapered section 20 and the narrowed extension 22 of the hose assembly 12 are each electrically conductive, and can be used to electrically connect to different conductive layers within the hose assembly 12 to an electrical circuit within the monitoring assembly 14. As such, electrical connection to the tapered section 20 and the narrowed extension 22 provides electrical interconnection to the conductive layers of the hose assembly 12.

Figure 7:
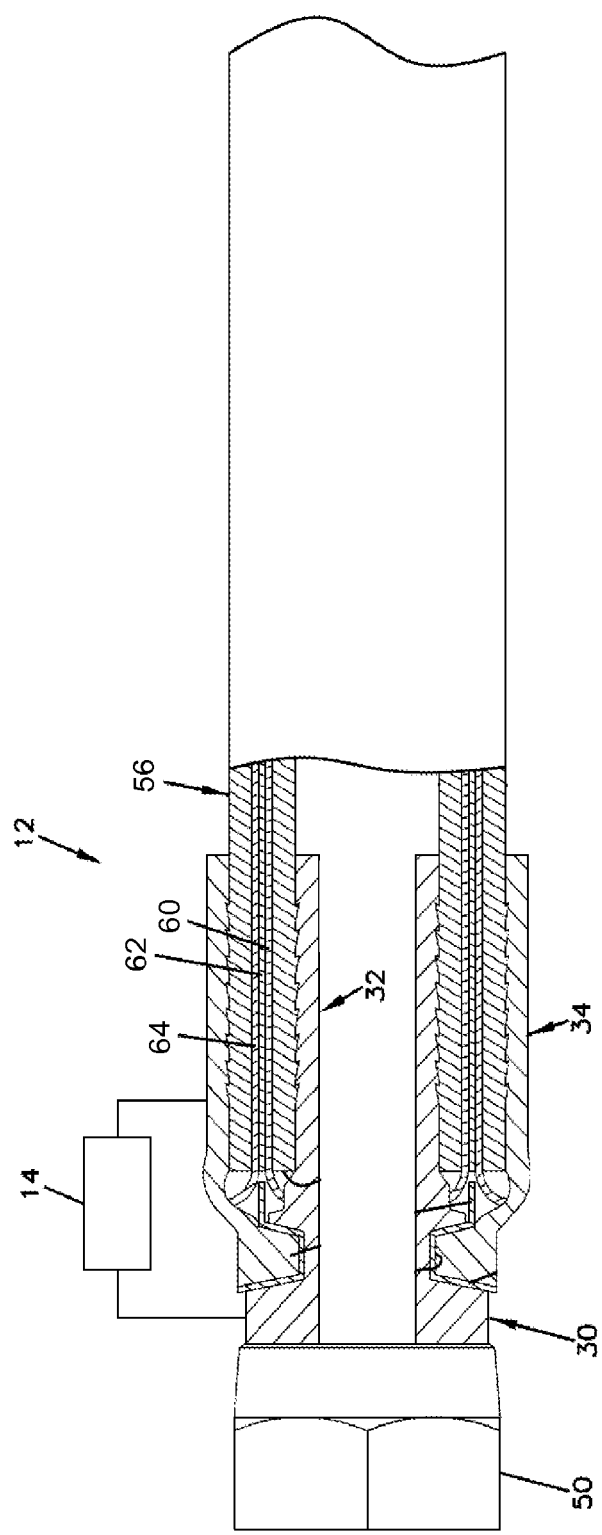
FIG. 7 is a schematic view of a hose assembly, according to an example embodiment.

Referring to FIG. 7, the hose assembly 12 includes a hose, generally designated 56, having a multi-layer construction. In the subject embodiment, the hose 56 is generally flexible and includes an inner tube 58 made from a polymeric material, such as rubber or plastic, or another material depending on the requirements of the particular application, a first conductive layer 60, an intermediate layer 62, a second conductive layer 64 and an outer cover 66. The first and second conductive layers 60, 64 define an electrical characteristic of the hose assembly 12, such as capacitance, inductance and/or resistance (impedance).

In the subject embodiment, the first conductive layer 60 overlays an inner tube 58 and the intermediate layer 62 overlays the first conductive layer 60. The second conductive layer 64 overlays the intermediate layer 62. The first and second conductive layers 60, 64 may be configured as reinforcing layers. The outer cover 66 may overlay the second conductive layer 64, and may include, for example, an extruded layer of rubber or plastic. The outer cover 66 may itself include a reinforcing layer.

The hose assembly 12 may include a hose fitting, generally designated 30, for fluidly coupling the hose assembly to another component. The hose fitting 30 may have any of a variety of different configurations depending, at least in part, on the requirements of the particular application. In the embodiment shown, the hose fitting 30 includes a nut 50 rotatably attached to the nipple 32. The nut 50 provides a means for securing the hose assembly 12 to another component.

In FIG. 7, the monitoring assembly 14 is illustrated schematically as connected to the tapered section 20 and the narrowed extension 22 surfaces. The monitoring assembly 14 may have any of a variety of configurations. In general, the monitoring assembly 14 is connectable over a portion of the hose assembly 12, in particular the portion illustrated in FIGS. 1-3. The monitoring assembly 14, when installed over hose assembly 12, forms a physical and electrical connection with the hose assembly 12, and in particular to nipple 32 and socket 34, respectively, at surfaces of the narrowed extension 22 and tapered section 20, respectively. Generally, the monitoring assembly 14 includes a circuit capable of detecting an electrical characteristic of the hose assembly 12, while validating the connection to the nipple 32 and socket 34.

The intermediate layer 62 operates to at least partially insulate electrically the first and second conductive layers 60, 64 from one another. The intermediate layer 62 may have any of a variety of constructions. For example, the intermediate layer 62 may consist of a single layer of an electrically resistive material. The intermediate layer 62 may also consist of multiple layers, wherein at least one of the layers exhibits electrical insulating properties. Certain composite materials may also be employed in the intermediate layer 62, such as a woven fabric bonded to a polymeric material. Composite materials having various other constructions may also be utilized. Composite materials may also be used in combination with other materials to form the intermediate layer 62. In some embodiments of the present disclosure, the insulating layer 24 represents an exposed portion of the intermediate layer 62; however, in alternative embodiments, the insulating layer can be an insert or other structure separating the conductive layers 60, 64. Generally, the conductive layers 60, 64 electrically connect to the tapered section 20 and narrowed extension 22, respectively.

The first and second conductive layers 60, 64 generally extend the entire length and span the entire circumference of the hose. This is generally the case when the conductive layer also functions as a reinforcement layer. The intermediate layer 62 may also extend over the entire length and circumference of the hose. There may be instances, however, where at least one of the first and second conductive layers 60, 64 extends only over a portion of the hose length and/or a portion of its circumference. In that instance, the intermediate layer 62 may also be configured to generally extend over the region of the hose containing the partial conductive layer 60, 64. The partial intermediate layer 62 may be positioned within the hose so as to separate the first and second conductive layers 60, 64 from one another.

Figure 8:
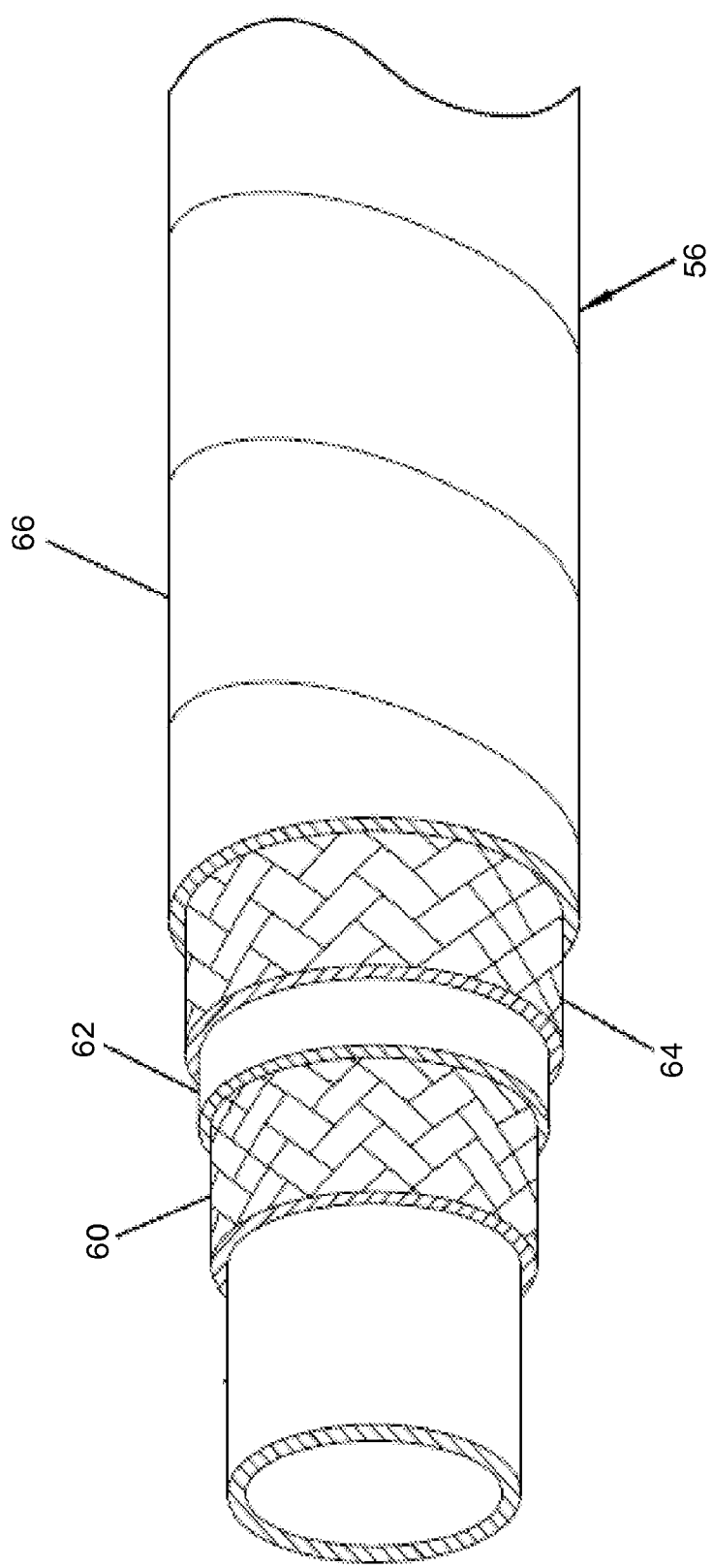
FIG. 8 is a perspective view, partially cut away, illustrating an exemplary hose employing a braided conductive layer that is suitable for use with the hose assembly of FIG. 7.
Figure 9:
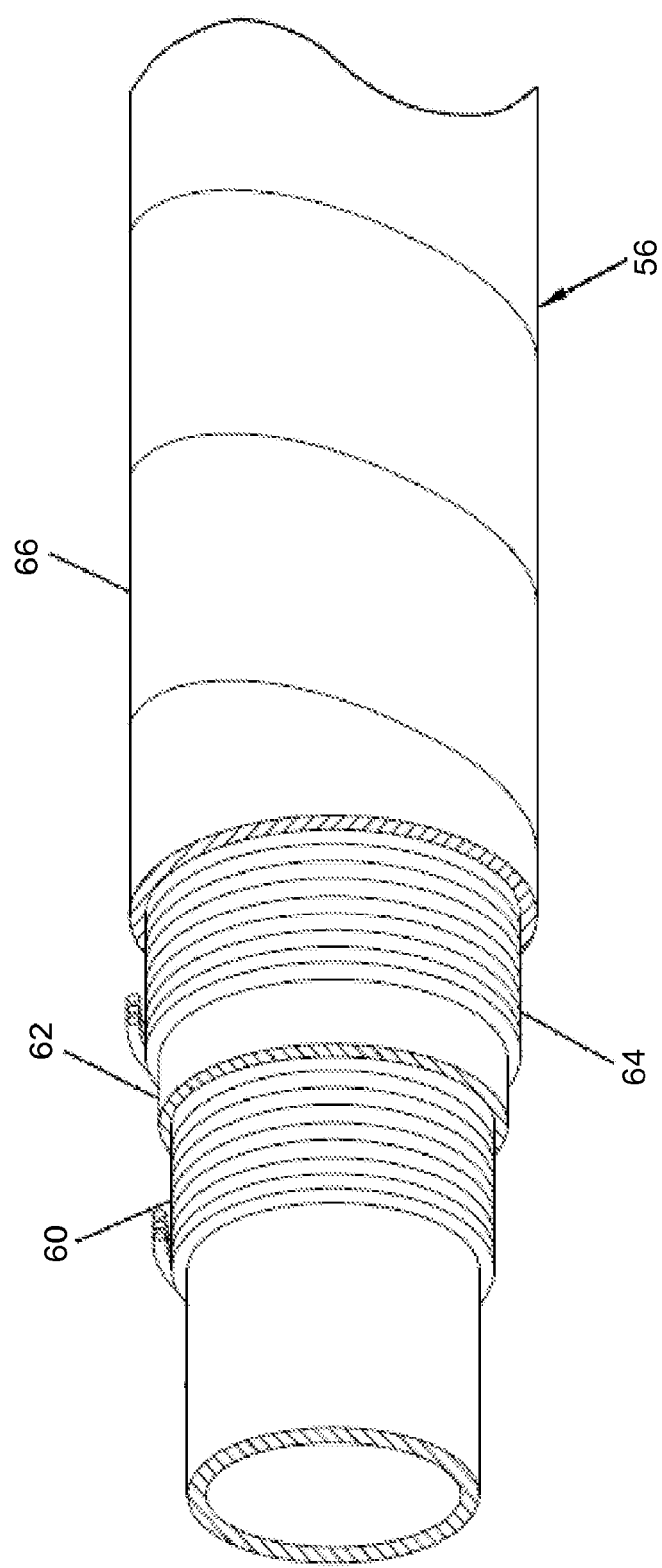
FIG. 9 is a perspective view, partially cut away, illustrating an exemplary hose employing a spiral wire conducting layer that is suitable for use with the hose assembly of FIG. 7.

Referring now to FIGS. 8 and 9, the first and second conductive layers 60, 64 may include, for example, an electrically conductive braided reinforcement material, such as shown in FIG. 8, or alternating layers of electrically conductive spiral reinforcement material, such as shown in FIG. 9. The braided reinforcement material may consist of a single layer or may include multiple layers. Although a two-wire spiral reinforcement arrangement is depicted in FIG. 9, it shall also be appreciated that other configurations, such as four and six wire arrangements, may also be utilized.

In general, additional details regarding the construction of an example hose assembly 12 are provided in U.S. patent application Ser. No. 13/458,691, filed on Apr. 27, 2012, and entitled "Degradation Monitoring System for Hose Assembly", the disclosure of which was previously incorporated by reference in its entirety.

Referring now to FIGS. 10-16, details regarding interconnection of the monitoring assembly 14 to the hose assembly 12 are provided. In general, and as seen specifically in FIG. 10, interconnection of these assemblies is provided by a plurality of wave contacts 100a-b and 102a-b positioned along an interior surface 31 of the hollow cylindrical monitoring assembly 14, such that when the monitoring assembly 14 is mounted to the hose assembly 12, the wave contacts 100a-b, 102a-b electrically interconnect to the tapered section 20 and narrowed extension 22, and consequently to layers 60, 64 of a hose assembly 12.

As seen generally in FIGS. 10-16, the wave contacts 100a-b, 102a-b generally are contacts having a plurality of bends therein and formed having an overall contour to be placed along the circumference of the hose assembly 12 at either the tapered section 20 or the narrowed extension 22. The wave contacts 100a-b, 102a-b are generally metallic or otherwise conductive elements formed from a generally stiff, resilient material. In the embodiments shown, in particular in FIGS. 11-12, the wave contacts 100a-b, 102a-b each have eight bend points, thereby forming five contact points between that contact and the respective conductive circumferential surface of the hose (i.e., one of sections 20, 22). In alternative embodiments, more or fewer contact points can be formed.

Figure 14:
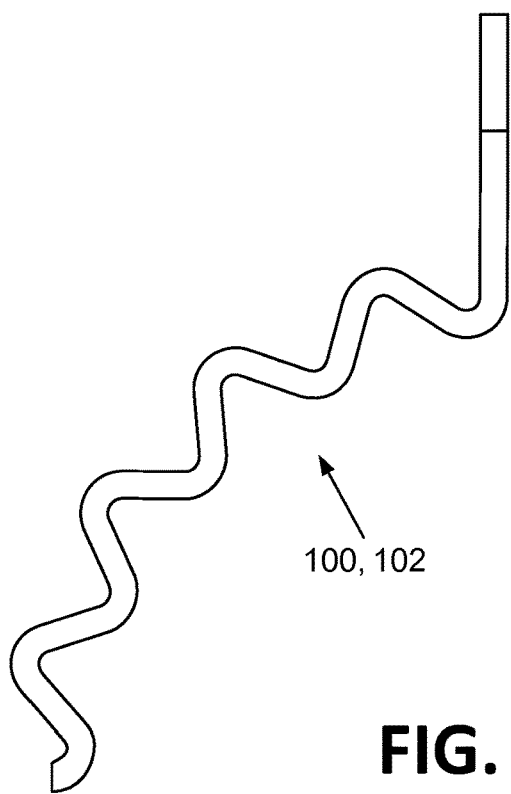
FIGS. 14-16 illustrate additional details of various possible embodiments of the wave contacts of the present disclosure. In the embodiment shown, the wave contact
Figure 15:
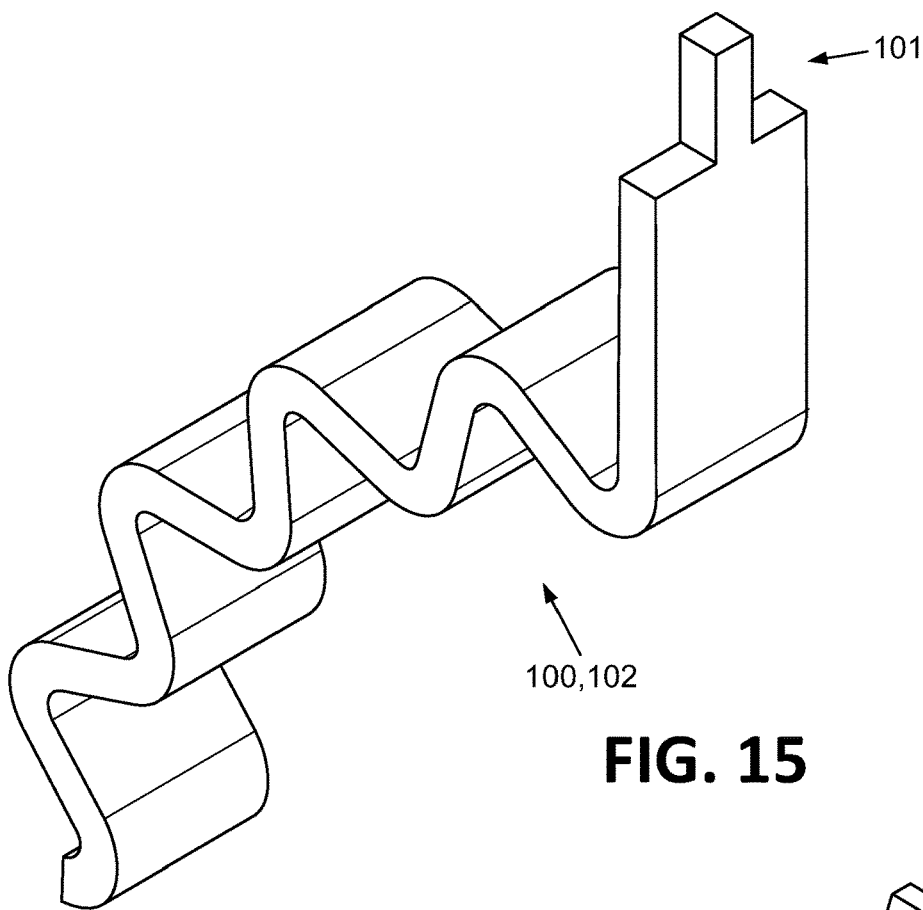
Figure 16:
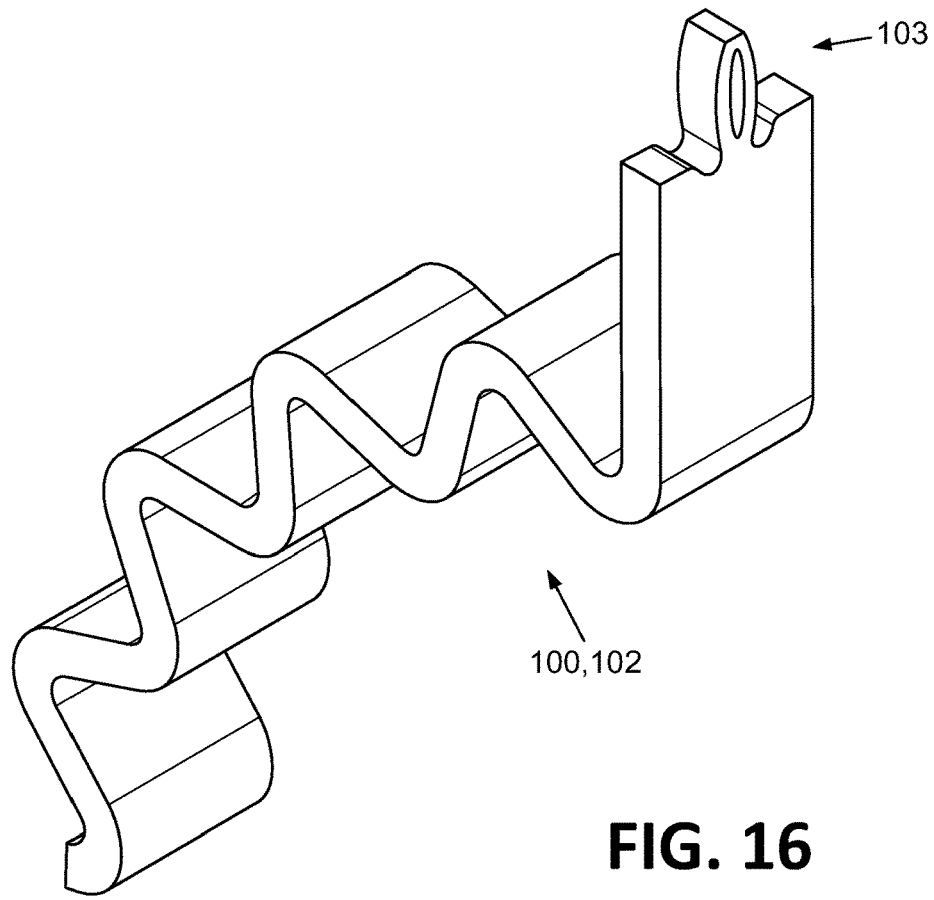

Further, as illustrated most clearly in FIGS. 14-16, each of the wave contacts generally is constructed to have an overall bend amount of about 90 degrees relative to a prior segment of the contact, thereby allowing for compression of the wave contact between the housing 15 of the monitoring assembly 14 and the respective surfaces of tapered section 20 and narrowed extension 22 of the hose assembly 12. In alternative embodiments, more or fewer bends in the wave contacts 100a-b, 102a-b can be used, resulting in different numbers of contact points between the wave contact and the conductive surface of tapered section 20 and narrowed extension 22 of the hose assembly 12.

Figure 10:
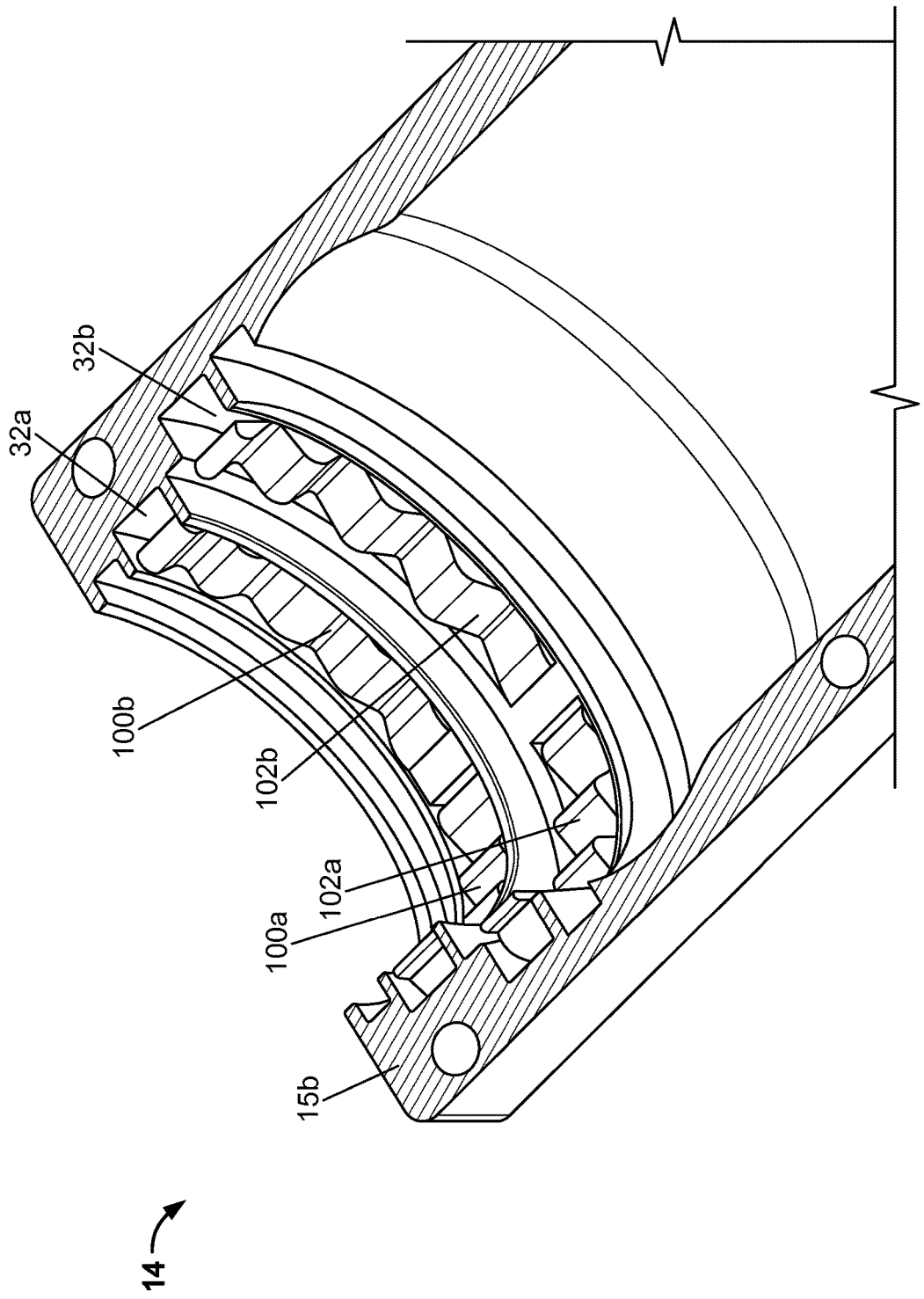
FIG. 10 is a perspective view of an inner surface of the monitoring assembly of FIGS. 5-6 illustrating a plurality of wave contacts positioned therein.

As seen specifically in FIG. 10, the interior surface 31 of the monitoring assembly includes a plurality of channels 32a-b extending circumferentially at least partially around the interior surface 31 of the monitoring assembly 14. The channels 32a-b are, in some embodiments, offset from one another to accommodate the different radii of the hose assembly at the tapered section 20 and narrowed extension 22. The channels 32a-b generally ensure alignment with the tapered section 20 and narrowed extension 22 when the monitoring assembly 14 is mounted on the hose assembly 12, and prevent unintentional axial movement of the wave contacts 100a-b, 102a-b, which may cause a shorting or other electrical malfunction if connection is made across the conductive surfaces of the tapered section 20 and narrowed extension 22, or if connection is entirely lost to one of those surfaces.

Figure 11:
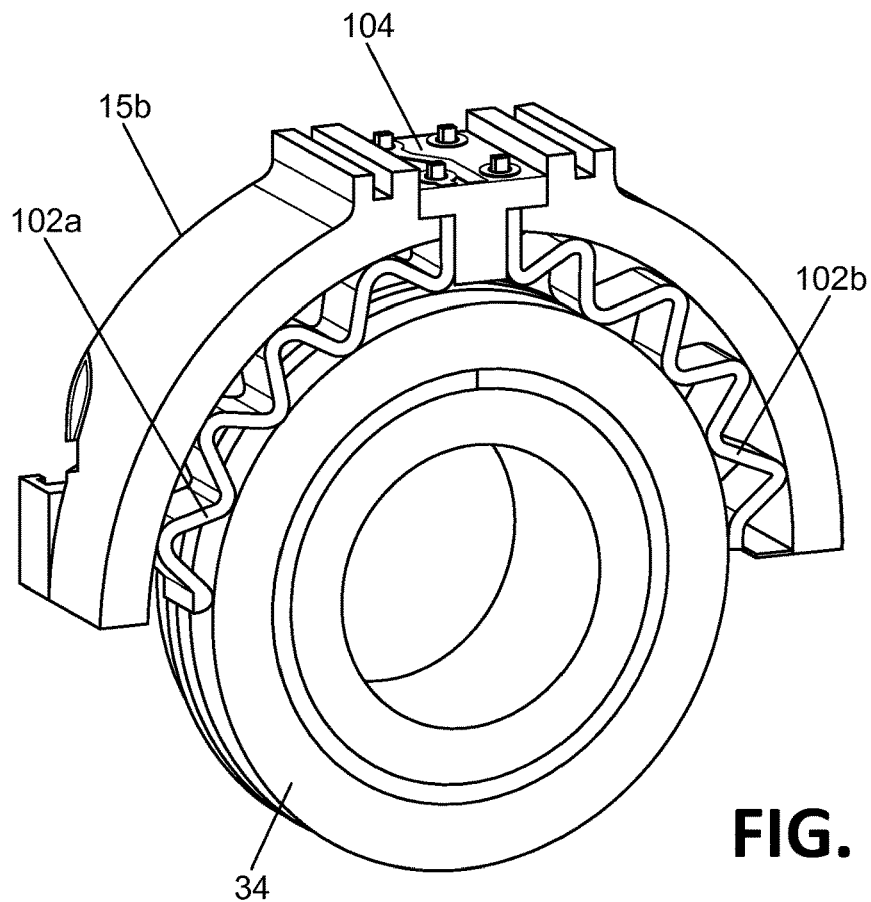
FIG. 11 is a cross-sectional view of the hose assembly and monitoring assembly of FIGS. 1-3 and particularly at plane A of FIG. 3, illustrating electrical connection of a first wave contact to a socket of the hose assembly.

FIGS. 11-12 show cross-sectional views of the wave contacts, housing portion 15a, and hose assembly 12 at cross sections A and B of FIG. 3. As seen in FIG. 11, a first set of wave contacts 100a-b electrically connect to a tapered section 20, and extend to a circuit board 104. FIG. 12 illustrates the second set of wave contacts 102a-b electrically connecting to the tapered section 20, and also extending to the circuit board 104. The circuit board 104 includes at least a portion of a monitoring circuit used to detect whether a failure of the hose has occurred, based on a change of an electrical characteristic of the hose due to introduction of voltage across the layers 60, 64 based on a voltage across the tapered section 20 and narrowed extension 22. Examples of possible circuits used on the circuit board 104 to detect hose failures are discussed in U.S. patent application Ser. No. 13/458,691, filed on Apr. 27, 2012, and entitled "Degradation Monitoring System for Hose Assembly", and U.S. Provisional Patent Application Nos. 61/701,325 and 61/701,344, each titled "Sense and Hold Circuit for Hose Assembly" and filed on Sep. 14, 2012, the disclosures of each of which are also incorporated by reference herein in its entirety.

In the embodiments shown in FIGS. 11-12, it can be seen that in some cases, the channels 32a-b in the housing 15 can have a common depth, and to contact the hose assembly 12 at surfaces of the tapered section 20 or the narrowed extension 22, different sizes or geometries of wave contacts can be used. In the example shown, wave contacts 100a-b have generally shorter segments between bends, resulting in a relatively narrower circumferential area in which they reside between the housing 15 and surface of the tapered section 20. In contrast, wave contacts 102a-b have generally larger segments between the bends of those contacts, thereby resulting in a relatively wider circumferential area in which they can reside without possible looseness (and resulting possible loss of electrical contact with the surface 22). In alternative embodiments, the channels 32a-b can be radially offset from one another to accommodate the different radii of the hose at surfaces 20, 22.

It is noted that in some embodiments of the present disclosure, when installed within an integrated hose assembly as illustrated herein, the wave contacts 100a-b and/or wave contacts 102a-b can be compressed or at least lightly biased against the surfaces 20, 22 by radial pressure applied by the housing 15, thereby ensuring continued contact between the wave contacts 100a-b, 102a-b and the surfaces 20, 22. Furthermore, although in the embodiments shown herein there are two wave contacts per surface to which contact is made, in alternative embodiments, only one such wave contact may be used. In still further embodiments, three or more wave contact elements can be used and interconnected around the circumference of the surfaces 20, 22.

As seen most clearly in FIGS. 6 and 12-13, in the example embodiment shown, the housing 15 has a removable cover 17 that, when removed, allows access to the circuit board 104. This allows for maintenance of the circuit board, or electrical testing, interconnection, or replacement of the circuit board 104 as may be required over the life of the hose. In some embodiments, the circuit implemented by the circuit board 104 is generally a low-power circuit that operates using battery power, and as such the cover 17 can be removed in the case where the battery is required to be changed.

Referring to FIGS. 15-16, it is noted that the wave contacts 100a-b, 102a-b (referred to generally as wave contacts 100, 102) can have a variety of types of interconnection structures used to electrically connect to the circuit board 104. In the embodiment shown in FIG. 15, a crimp-style or solder-style electrical contact 101 is used, while in the embodiment shown in FIG. 16, a compliant-style electrical contact 103 is used. Other types of electrical contacts can be used, and in fact different types of electrical contacts can be used within the same assembly.

Referring to FIGS. 10-16, it is noted that although a particular geometry and size of wave contacts are disclosed herein, other sizes or geometries of wave contacts could be used as well. For example, a wave contact to be used with a hose having a larger radius would have a less pronounced overall curvature, to accommodate the circumferential shape of that hose. Furthermore, such a wave contact may be constructed to be generally wider or narrower to accommodate a particular surface of the hose, or longer or shorter to electrically connect to the hose and accommodate the geometry of the housing 15 of the monitoring assembly 14 as well.

Referring to FIGS. 1-16 generally, it is noted that use of the wave contacts disclosed herein provides a number of advantages over existing electrical connection schemes used in connection with hose assemblies. For example, the additional electrical contact points and natural compressive resiliency against surfaces of the hose assembly provides a more reliable electrical connection to the hose assembly 12. Furthermore, and in particular in the case where the wave contacts are used to electrically connect to a generally circular surface, the overall monitoring arrangement can be rotated around the axis of the hose assembly when mounted, which provides a number of additional advantages. For example, convenient access to the circuit board 104 via cover 17 can be provided, irrespective of the orientation of the hose assembly when mounted and in use. Furthermore, rotation of the monitoring assembly around the hose assembly has a natural, light abrasive effect between the wave contacts 100a-b, 102a-b and the surfaces 20, 22, respectively. This light abrasive effect can be used periodically to clean the contact points between the wave contacts and surfaces, thereby allowing a user of such an assembly 10 to attempt to fix electrical connectivity issues during use of the integrated hose assembly 10 by rotating the monitoring assembly.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. An integrated hose assembly with monitoring comprising:
 a hose assembly including a hose having a first conductive layer and a second conductive layer, the first conductive layer electrically connected to a nipple and the second conductive layer electrically connected to a socket, and wherein the first and second conductive layers are separated by an insulating layer; and
 a monitoring assembly comprising:
  a housing rotatably mounted around at least a portion of the hose assembly;
  a first wave contact seated within the housing and rotatably maintaining electrical contact with a first outer surface of the hose assembly that is electrically connected to the first conductive layer;
  a second wave contact seated within the housing and rotatably maintaining electrical contact with a second outer surface of the hose assembly that is electrically connected to the second conductive layer;
  a third wave contact seated within the housing and electrically contacting the first outer surface of the hose assembly;
  a fourth wave contact seated within the housing and electrically contacting the second outer surface of the hose assembly; and
  a monitoring circuit electrically connected to the first wave contact, the second wave contact, the third wave contact, and the fourth wave contact;
 wherein the first wave contact is contoured to contact the first outer surface at a plurality of contact points spaced apart from one another circumferentially around the hose assembly and the second wave contact is contoured to contact the second outer surface at a plurality of contact points spaced apart from one another circumferentially around the hose assembly, the first and second outer surfaces being axially offset from one another.

2. The integrated hose assembly of claim 1, wherein the first and second wave contacts each include a crimp-style connection.

3. The integrated hose assembly of claim 1, wherein the first and second wave contacts each include a compliant-style connection.

4. The integrated hose assembly of claim 1, wherein the first surface and the second surface are electrically separated by the insulating layer.

5. The integrated hose assembly of claim 1, wherein the first wave contact and the second wave contact are both radially offset from one another.

6. The integrated hose assembly of claim 5, wherein the housing includes a plurality of channels positioned in alignment with the first and second outer surfaces, the plurality of channels configured to retain the first and second wave contacts.

7. The integrated hose assembly of claim 1, wherein each of the first and second wave contacts are constructed from conductive materials.

8. The integrated hose assembly of claim 1, wherein each of the first and second wave contacts are compressed against the first and second outer surfaces, respectively, by the housing.

9. The integrated hose assembly of claim 1, wherein the housing includes a first channel positioned in alignment with the first outer surface and a second channel positioned in alignment with the second outer surface, the first channel and the second channel having a common depth, and the first and second wave contacts having different sizes to accommodate different radii of the first and second outer surfaces.

10. A monitoring assembly comprising:
 a housing rotatably mountable around at least a portion of a hose assembly having first and second electrically conductive outer surfaces forming contact points for an electrical circuit including the hose assembly;
 a first wave contact seated within the housing and rotatably maintaining electrical contact with the first outer surface of the hose assembly at a plurality of points spaced apart from one another circumferentially around the hose assembly;
 a second wave contact seated within the housing and rotatably maintaining electrical contact with the second outer surface of the hose assembly at a plurality of points spaced apart from one another circumferentially around the hose assembly, the first and second outer surfaces being axially offset from one another;
 a third wave contact seated within the housing and electrically contacting the first outer surface of the hose assembly;
 a fourth wave contact seated within the housing and electrically contacting the second outer surface of the hose assembly; and
 a monitoring circuit electrically connected to the first wave contact, the second wave contact, the third wave contact, and the fourth wave contact.

11. The monitoring assembly of claim 10, wherein the housing includes a first channel configured to retain the first wave contact and a second channel configured to retain the second wave contact.

12. The monitoring assembly of claim 10, wherein the wave contacts have a number of bends based at least in part on a thickness, a material, and a length of the wave contact.

13. The monitoring assembly of claim 10, wherein the first wave contact and the third wave contact electrically connect to a first electrical connection of the monitoring circuit, and wherein the second wave contact and the fourth wave contact electrically connect to a second electrical connection of the monitoring circuit.

14. The monitoring assembly of claim 10, wherein the monitoring circuit is configured to apply a voltage across the first and second conductive outer surfaces, thereby applying a voltage across first and second conductive layers of a hose assembly.

15. The monitoring assembly of claim 10, wherein the first wave contact has a first arch profile matched to a diameter of the first electrically conductive outer surface and the second wave contact has a second arch profile matched to a second diameter of the second electrically conductive outer surface.

16. The monitoring assembly of claim 10, wherein each of the first and second wave contacts includes a plurality of bend points, wherein at least some of the plurality of bend points are configured to contact the corresponding electrically conductive outer surface.

17. A method of contacting a monitoring assembly to a hose assembly, the method comprising:
 rotatably mounting a housing of a monitoring assembly around at least a portion of a hose assembly, thereby rotatably maintaining electrical contact between a first electrically conductive outer surface of the hose assembly at a plurality of points spaced apart from one another circumferentially around the hose assembly with a first wave contact and a third wave contact and rotatably maintaining electrical contact between a second electrically conductive outer surface of the hose assembly at a plurality of points spaced apart from one another circumferentially around the hose assembly with a second wave contact and a fourth wave contact, the first second, third, and fourth wave contacts each electrically connected to a monitoring circuit within the housing, the first and second outer surfaces being axially offset from one another.

18. The method of claim 17, further comprising rotating the monitoring assembly around the hose assembly, thereby scraping the first and second wave contacts across the first and second outer surfaces.

* * * * *